United States Patent [19]
Hoshino

[11] Patent Number: 5,144,584
[45] Date of Patent: Sep. 1, 1992

[54] SEMICONDUCTOR MEMORY DEVICE

[75] Inventor: Yasuharu Hoshino, Tokyo, Japan

[73] Assignee: NEC Corporation, Tokyo, Japan

[21] Appl. No.: 622,067

[22] Filed: Dec. 4, 1990

[30] Foreign Application Priority Data

Dec. 4, 1989 [JP] Japan .................................. 1-315802

[51] Int. Cl.⁵ .............................................. G11C 13/00
[52] U.S. Cl. ................................ 365/222; 365/230.01
[58] Field of Search .............. 365/222, 230.01, 189.01, 365/189.02, 189.05, 230.06

[56] References Cited
U.S. PATENT DOCUMENTS
4,855,959 8/1989 Kobayashi .
4,982,369 1/1991 Tatematsu ........................... 365/222

Primary Examiner—Terrell W. Fears
Attorney, Agent, or Firm—Sughrue, Mion, Zinn, Macpeak & Seas

[57] ABSTRACT

A semiconductor memory device comprises a random memory cell array halved into first and second memory areas, and a data register coupled to digit lines of the random memory cell array in parallel for temporarily holding data read out onto the respective digit lines from selected memory cells. A row address generator receives an input row address and generates a first row address signal designating a first row corresponding to the input row address, and a second row address designating a second row different from the first row. A controller is coupled to first and second half portions of each of the word lines, and responds to the first and second row address signals so as to cause to transfer to the data register, data stored in the memory cells which are included in one row designated by the first row address signal and which belong to one of the first and second memory areas, and also so as to cause to refresh the memory cells which are included in one row designated by the second row address signal and which belong to the other of the first and second memory areas.

5 Claims, 5 Drawing Sheets

SEMICONDUCTOR MEMORY DEVICE

BACKGROUND OF THE INVENTION

1 Field of the invention

The present invention relates to a semiconductor memory device, and more specifically, to a semiconductor memory device having a split data transfer function.

2 Description of related art

In the prior art, this type of semiconductor memory has been used as an image display memory for a CRT (cathode ray tube) display and other displays. When a split data transfer is performed, a refresh operation is executed for all memory cells on one word line selected by a given row address, so that data stored in each of the memory cells on the selected word line is amplified and then rewritten to the same memory cell, and a portion of the amplified data is transferred to a data register.

Referring to U.S. Pat. No. 4,855,959 to Kobayashi, there is shown one typical conventional example of the semiconductor memory device having a split data transfer function. In this semiconductor memory device, a memory cell matrix of the semiconductor memory device is halved in function of the split data transfer operation in such a manner that each of word lines is halved into a lower portion and an upper portion, so that digit lines are also halved into a lower group of digit lines and an upper group of digit lines, and in addition, a date register is correspondingly halved into an upper portion and an upper portion.

When a split data transfer is performed, word lines of the semiconductor memory device are sequentially selected as follows:

In a first operation of split data transfer, data stored in the lower portion of a (0)th word line is transferred through the lower group of digit lines to the lower portion of the data register. Thereafter, the data stored in the lower portion of the data register is sequentially read out to the outside of the memory device in synchronism with clock signals supplied to the memory device. In the way of the data reading-out from the lower portion of the data register, a second operation of split data transfer is performed, so that data stored in the upper portion of the (0)th word line is transferred through the upper group of digit lines to the upper portion of the data register. The above mentioned operation is repeated for each of the remaining words lines in the order, so that the data stored in the memory device is serially and continuously outputted.

Here, attention is focused on the refresh operation carried out concurrently with the split data transfer. In the first operation of split data transfer performed for the lower portion of the (0)th word line, the refresh operation is carried out not only for all the memory cells included in the lower portion of the (0)th word line but also for the memory cells included in the upper portion of the (0)th word line. In addition, in the second operation of split data transfer performed for the upper portion of the (0)th word line, the refresh operation is also carried out not only for all the memory cells of the upper portion of the (0)th word line, but also for the memory cells of the lower portion of the (0)th word line. Namely, the refresh operation is executed for the same memory cells two times within a very short period of time. However, it is sufficient if the refresh operation is performed only one time within a predetermined or standardized period of time for each of the memory cells. In other words, one of the refresh operations executed two times within the very short period of time for all the memory cells of the same word line is not necessary, and rather, wasteful from a viewpoint of efficiency in the refresh operation.

The conventional semiconductor memory device having the split data transfer function has been proposed as the image display memory for the CRT display and other displays, which have a nature or restriction in which image information is required to be periodically and sequentially supplied by units of one pixel. The conventional semiconductor memory device has been satisfactory from the viewpoint of function in the image display memory. As mentioned above, however, the conventional semiconductor memory device has been disadvantageous in that the refresh operation is less efficient.

SUMMARY OF THE INVENTION

Accordingly, it is an object of the present to invention to provide a semiconductor memory device which has overcome the above mentioned defect of the conventional one.

Another object of the present invention is to provide a semiconductor memory device having the split data transfer function and having a high refresh efficiency.

The above and other objects of the present invention are achieved in accordance with the present invention by a semiconductor memory device comprising:

a random memory cell array including a number of memory cells arranged in the form of a matrix and having a plurality of word lines and a plurality of digit lines so that access can be permitted to a selected memory cell by selecting one word line in accordance with a row address and also selecting one digit line in accordance with a column address, the random memory cell array being divided into first and second memory areas in such a manner that each of the word lines is divided into first and second portions and the digit lines are divided into a first group of digit lines and a second group of digit lines;

a data register means coupled to the digit lines of the random memory cell array in parallel for temporarily holding data read out onto the respective digit lines from selected memory cells;

a row address generator receiving an input row address and for generating a first row address signal designating a first row corresponding to the input row address, and a second row address designating a second row different from the first row; and a controller means coupled to the first and second portions of each of the word lines, and responding to the first and second row address signals so as to cause to transfer to the data register means, data stored in the memory cells which are included in one row designated by the first row address signal and which belong to one of the first and second memory areas, and also so as to cause to refresh the memory cells which are included in one row designated by the second row address signal and which belong to the other of the first and second memory areas.

The above and other objects, features and advantages of the present invention will be apparent from the following description of preferred embodiments of the invention with reference to the accompanying drawings.

DESCRIPTION OF THE PREFERRED EMBODIMENTS

Figure 1:
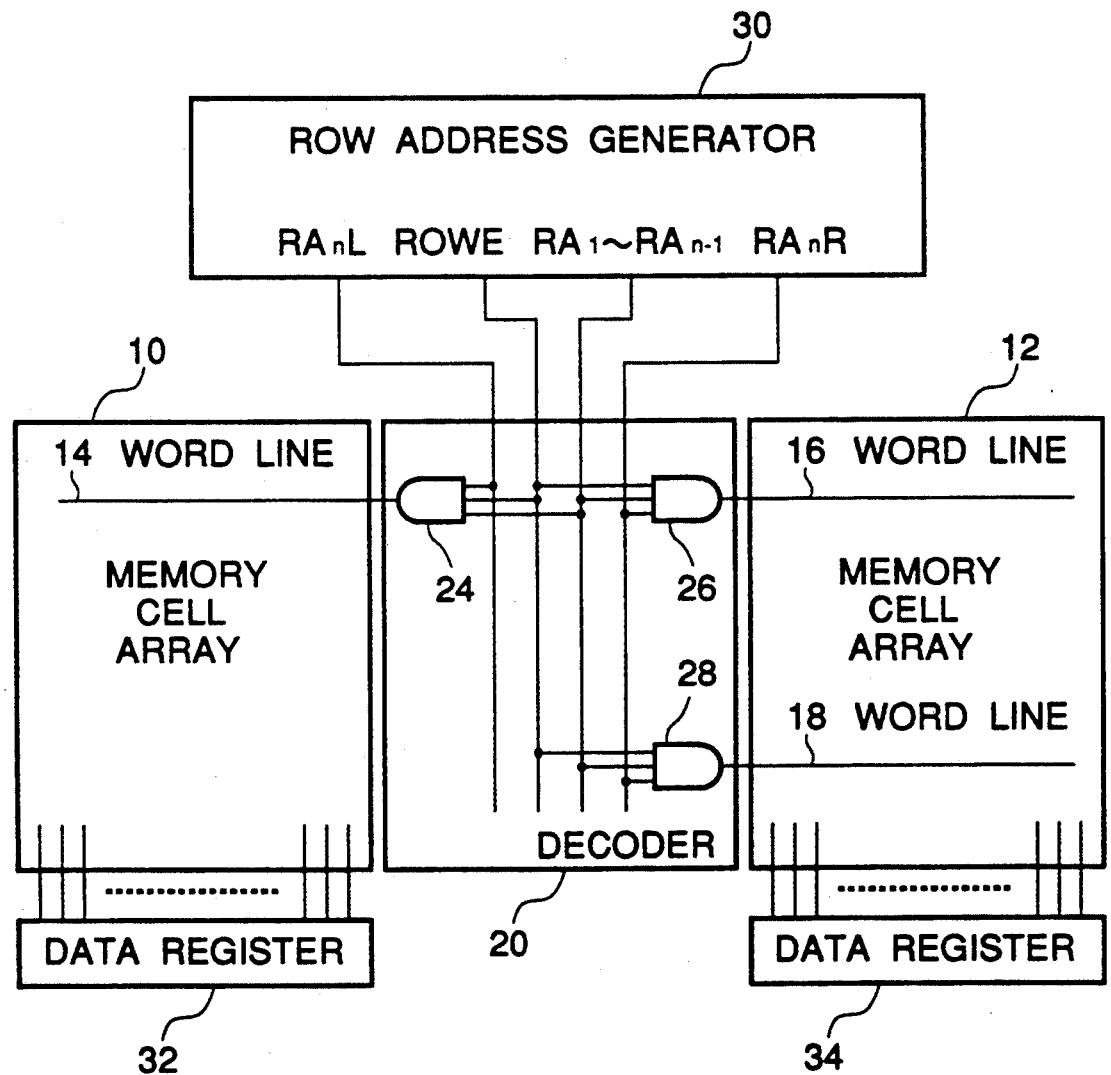
FIG. 1 is a block diagram of a memory cell array section of a first embodiment of the semiconductor memory device in accordance with the present invention.

Referring to FIG. 1, there is shown a block diagram of a memory cell array section of a first embodiment of the semiconductor memory device in accordance with the present invention. In other words, FIG. 1 shows only an essential portion of the semiconductor memory device in accordance with the present invention. Therefore, as regards peripheral devices of the memory cell array section not shown in FIG. 1, reference should be made to the above referred U.S. Pat. No. 4,855,959 to Kobayashi. Accordingly, the disclosure of U.S. Pat. No. 4,855,959 is incorporated herein.

The memory cell array section of the semiconductor memory device in accordance with the present invention includes a number of memory cells arranged in the form of a matrix having $2^n$ rows and $2^m$ columns ("n" and "m" are natural numbers) so that each of the memory cells is located at a corresponding one of intersections between $2^n$ word lines and $2^m$ digit lines so that access can be permitted to a memory cell at one selected intersection by selecting one word line in accordance with a row address of "n" bits and also selecting one digit line in accordance with a column address of "m" bits.

As shown in FIG. 1, the memory cell array section of the semiconductor memory device in accordance with the present invention is halved into a first or lower half memory cell array 10 and a second or upper half memory cell array 12, each of the lower and upper half memory cell arrays 10 and 12 includes the above mentioned $2^n$ word lines. In other words, each of the $2^n$ word lines is correspondingly halved into a first or lower half portion belonging to the lower half memory cell array 10 and a second or upper half portion belonging to the upper half memory cell array 12. On the other hand, the $2^m$ digit lines are halved into a first or lower group of $2^{m-1}$ digit lines belonging to the lower half memory cell array 10 and a second or upper group of $2^{m-1}$ digit lines belonging to the lower half memory cell array 12.

As mentioned above, the lower half memory cell array 10 includes the $2^n$ word lines, but only one word line designated by Reference Numeral 14 is shown for simplification of the drawing. Similarly, the upper half memory cell array 12 includes the $2^n$ word lines, but only two word lines respectively designated by Reference Numerals 16 and 18 are shown for simplification of the drawing. The word line 16 in the upper half memory cell array 12 has a row address which is the same as that of the word line 14 of the lower half memory cell array 10, and is different from the row address from the word line 18 of the same upper half memory cell array 12. In other words, the word line 14 of the lower half memory cell array 10 and the word line 16 of the upper half memory cell array 12 respectively constitute a lower half portion and an upper half portion of one word line having the same row address.

Each of the word lines of the lower and upper half memory cell arrays 10 and 12 is connected to a corresponding output of a decoder circuit 20, which in turn receives a group of row address signals $RA_1$ to $RA_{n-1}$, $RA_{nL}$, $RA_{nR}$ and ROWE from a row address generator 30. In this connection, address signal lines for the row address signals $RA_1$ to $RA_{n-1}$ are actually composed of a corresponding number of conductors, but are represented by a single line in FIG. 1 for simplification of the drawing.

The decoder circuit 20 includes a first or lower set of decoders of the number corresponding to the number of the word lines included in the lower half memory cell array 10, an output of each decoder of the lower set of decoders being connected to a corresponding one word line of the lower half memory cell array 10. The decoder circuit 20 also includes a second or upper set of decoders of the number corresponding to the number of the word lines included in the upper half memory cell array 12, an output of each decoder of the upper set of decoders being connected to a corresponding one word line of the upper half memory cell array 12. As seen from the above, the decoder circuit 20 includes $2 \times 2^n$ decoders, but only decoders 24, 26 and 28 connected to the word lines 14, 16 and 18 are shown in FIG. 1 for simplification of the drawing. In addition, although each decoder is shown in the form of an AND gate and each row address signal line extending from the row address generator 30 is directly connected to each AND gate for simplification of the drawings, it should be understood that the address signal lines extending from the row address generator 30 are connected to the AND gates selectively through an inverter (not shown) or directly, so that a "n"-to-$2^n$ decoding circuit is formed in a well known manner by all the AND gates connected to each of the lower and upper memory cell arrays 10 and 12.

The signal ROWE functions as an enable signal for the decoder circuit 20. Therefore, the signal ROWE is supplied to all the decoders included in the decoder circuit 20.

The row address signals $RA_1$ to $RA_{n-1}$ are supplied to all the decoders included in the decoder circuit 20. The row address signal $RA_{nL}$ is supplied to all the decoders connected to the word lines included in the lower memory cell array 10, and the row address signal $RA_{nR}$ is supplied to all the decoders connected to the word lines included in the upper memory cell array 12.

The lower group of digit lines included in the lower memory cell array 10 are connected to a first or lower data register 32 in parallel, and the upper group of digit lines included in the lower memory cell array 12 are connected to a second or upper data register 34 in parallel.

Figure 2:
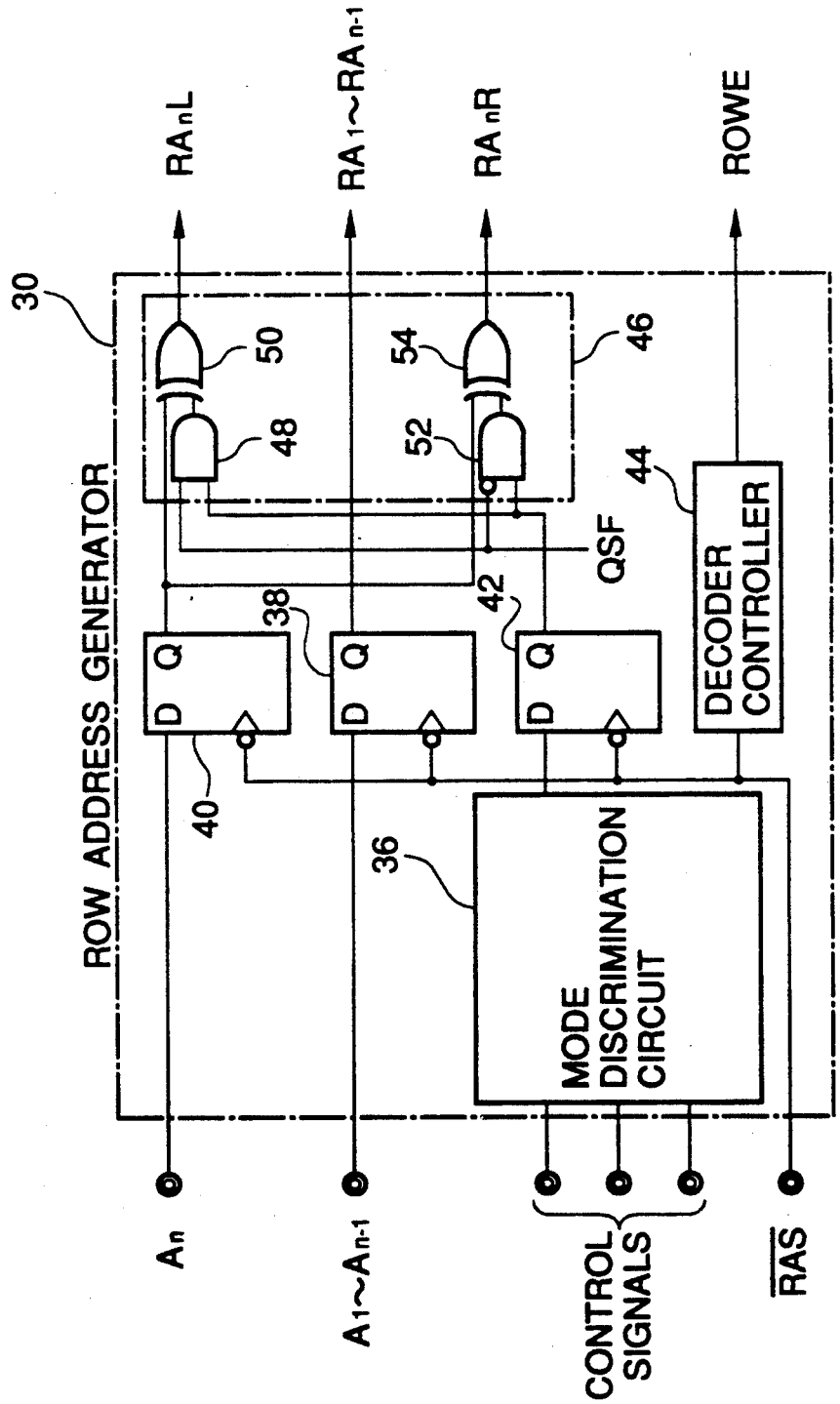
FIG. 2 is a logic circuit diagram of the row address generator used in the semiconductor memory device shown in FIG. 1.

Referring to FIG. 2, there is shown a logic circuit diagram of the row address generator 30.

As shown in FIG. 2, the row address generator 30 includes a mode discrimination circuit 36 receiving control signals excluding a row address probe signal $\overline{RAS}$ in order to discriminate whether or not a split data transfer should be performed and to output an active split data transfer mode signal when the split data transfer should be performed, and flipflops 38 and 40 for temporarily holding external address signals $A_1$ to $A_{n-1}$ and $A_n$, respectively. Actually, flipflops of the number $(n-1)$ corresponding to the external address signals $A_1$ to $A_{n-1}$ are provided, but are represented by only one flipflop 38 in FIG. 2 for simplification of the drawing. In addition, there are provided a flipflop 42 for temporarily holding an output of the mode discrimination circuit 36, and a decoder control circuit 44 connected to receive the row address probe signal $\overline{RAS}$ so as to delay and invert the received row address probe signal, so that the delayed and inverted row address probe signal is outputted as the control signal ROWE. The row address probe signal $\overline{RAS}$ is also applied to latch timing inputs of all the flipflops 38, 40 and 42.

Q outputs of all the flipflops 38, 40 and 42 and a control signal QSF are supplied to a combination logic circuit 46. This control signal QSF designates which of the half memory cell arrays 10 and 12 should be read out to the corresponding data register. In the combination logic circuit 46, the Q output of the flipflop 38 is outputted, without modification, as the row address signal $RA_1$ to $RA_{n-1}$. The Q output of the flipflop 42 and the control signal QSF are inputted to an AND gate 48, whose output is inputted together with the Q output of the flipflop 40 to an exclusive OR gate 50. This exclusive OR gate 50 outputs the row address signal $RA_{nL}$. In addition, the Q output of the flipflop 42 and an inverted signal of the control signal QSF are inputted to an AND gate 52, whose output is inputted together with the Q output of the flipflop 40 to an exclusive OR gate 54. This exclusive OR gate 54 outputs the row address signal $RA_{nR}$.

In response to the row address probe signal $\overline{RAS}$, the external address signals $A_1, \ldots A_{n-1}, A_n$ and the split data transfer mode signal outputted from the mode discrimination circuit 36 are latched in the flipflops 38, 40 and 42.

As mentioned above, when the split data transfer should be performed, the mode discrimination circuit 36 outputs the active split data transfer mode signal of a logic level "1". In addition, when data read from the lower half memory cell array 10 should be transferred to the associated data register, the control signal QSF is brought into a logical level of "0". In this situation, the AND gate 48 outputs a logic level of "0", and the AND gate 52 outputs a logic level of "1". Therefore, the most significant bit $A_n$ of the external address latched in the flipflop 40 is outputted as it is through the exclusive OR gate 50 of the combination logic circuit 46 as the most significant row address signal $RA_{nL}$, which is applied together with the other row address signals $RA_1$ to $RA_{n-1}$, to all the decoders associated to the lower half memory cell array 10. As a result, for example, the word line 14 is selected. Furthermore, the most significant bit $A_n$ of the external address latched in the flipflop 40 is inverted by the exclusive OR gate 54 of the combination logic circuit 46 and the inverted signal is outputted as the most significant row address signal $RA_{nR}$, which is applied together with the other row address signals $RA_1$ to $RA_{n-1}$, to all the decoders associated to the upper half memory cell array 12. As a result, for example, the word line 16 corresponding to the word line 14 is not selected, and the word line 18 apart from an address designated by the external address signals $A_1$ to $A_n$ by $2^{n-1}$ is selected.

In operation modes other than the split data transfer, the mode discrimination circuit 36 outputs an inactive split data transfer mode signal of a logic level "0". In this case, since both of the AND gates 48 and 52 outputs a logic level of "0", regardless of whether the control signal QSF is of "0" or "1", the most significant bit $A_n$ of the external address latched in the flipflop 40 is outputted as it is as the most significant row address signals $RA_{nL}$ and $RA_{nR}$. Accordingly, the disclosed memory device can operate similarly to the conventional memory device having no split data transfer function.

Figure 3:
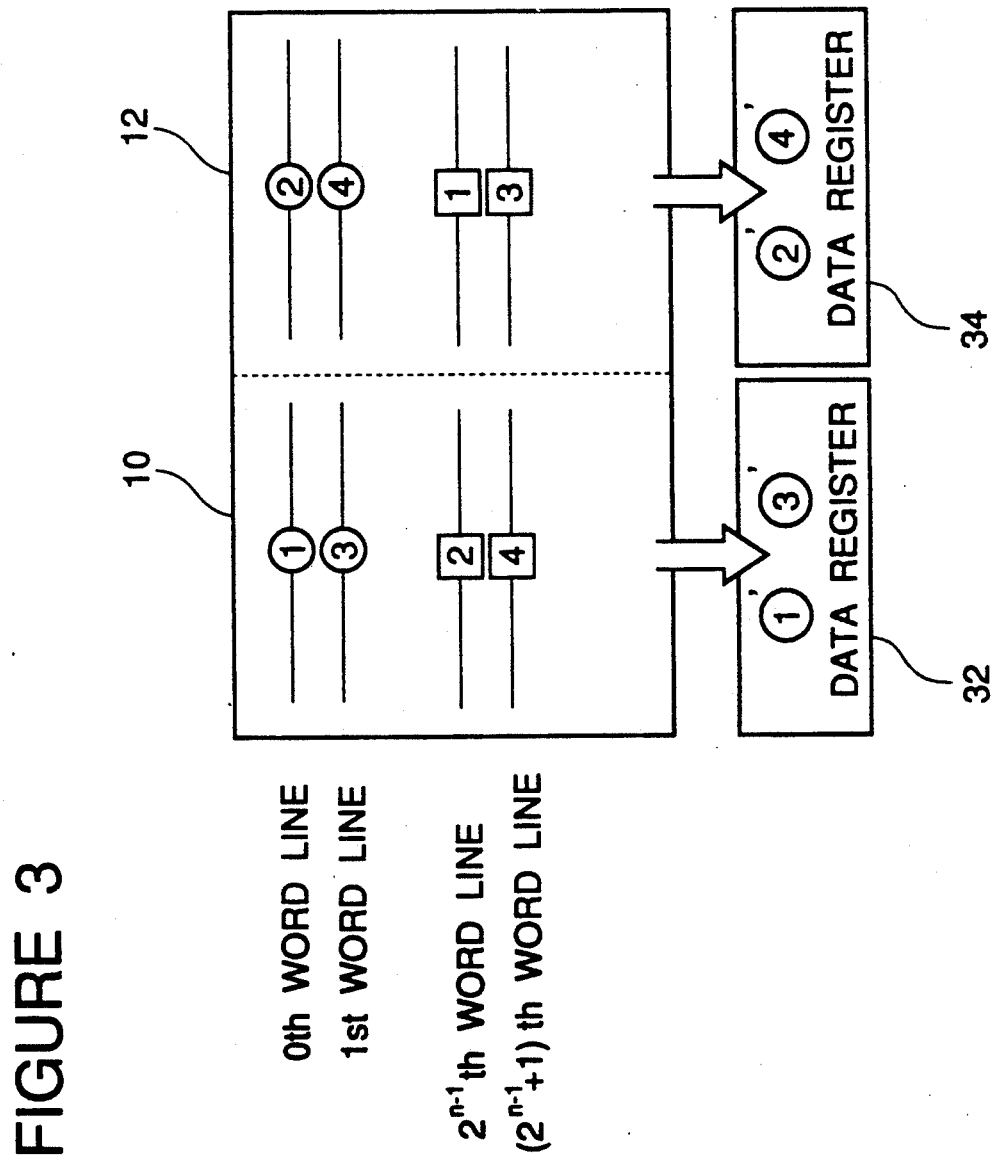
FIG. 3 illustrates the order of selection of the word lines in the split data transfer in the semiconductor memory device shown in FIG. 1.

Referring to FIG. 3, there is illustrated the order of selection of the word lines in the split data transfer in the semiconductor memory device shown in FIG. 1.

The word lines are selected as follows in the split data transfer mode. In the first operation of the split data transfer, a 0th word line ① is selected in the lower memory cell array 10 to be data-transferred, and data stored in the memory cells on the 0th word line ① is refreshed and transferred to the associated data register 32, but a $2^{n-1}$th word line ①̄ is also selected in the upper memory cell array 12 which should not be data-transferred, and a refresh operation is performed for the memory cells on the $2^{n-1}$th word line ①̄. In a second operation of the split data transfer, a 0th word line ② is selected in the upper memory cell array 12 to be data-transferred, and data stored in the memory cells on the 0th word line ② is refreshed and transferred to the associated data register 34, but a $2^{n-1}$th word line ②̄ is also selected in the lower memory cell array 10 which should not be data-transferred, and a refresh operation is performed for the memory cells on the $2^{n-1}$th word line ②̄. Similarly, third and succeeding operations of the split data transfer are performed. Therefore, focusing on the refresh operation, the memory cells are refreshed at every $2^{n-1}$ split data transfer cycles, namely, at an interval corresponding to the $2^{n-1}$ word lines.

Figure 4:
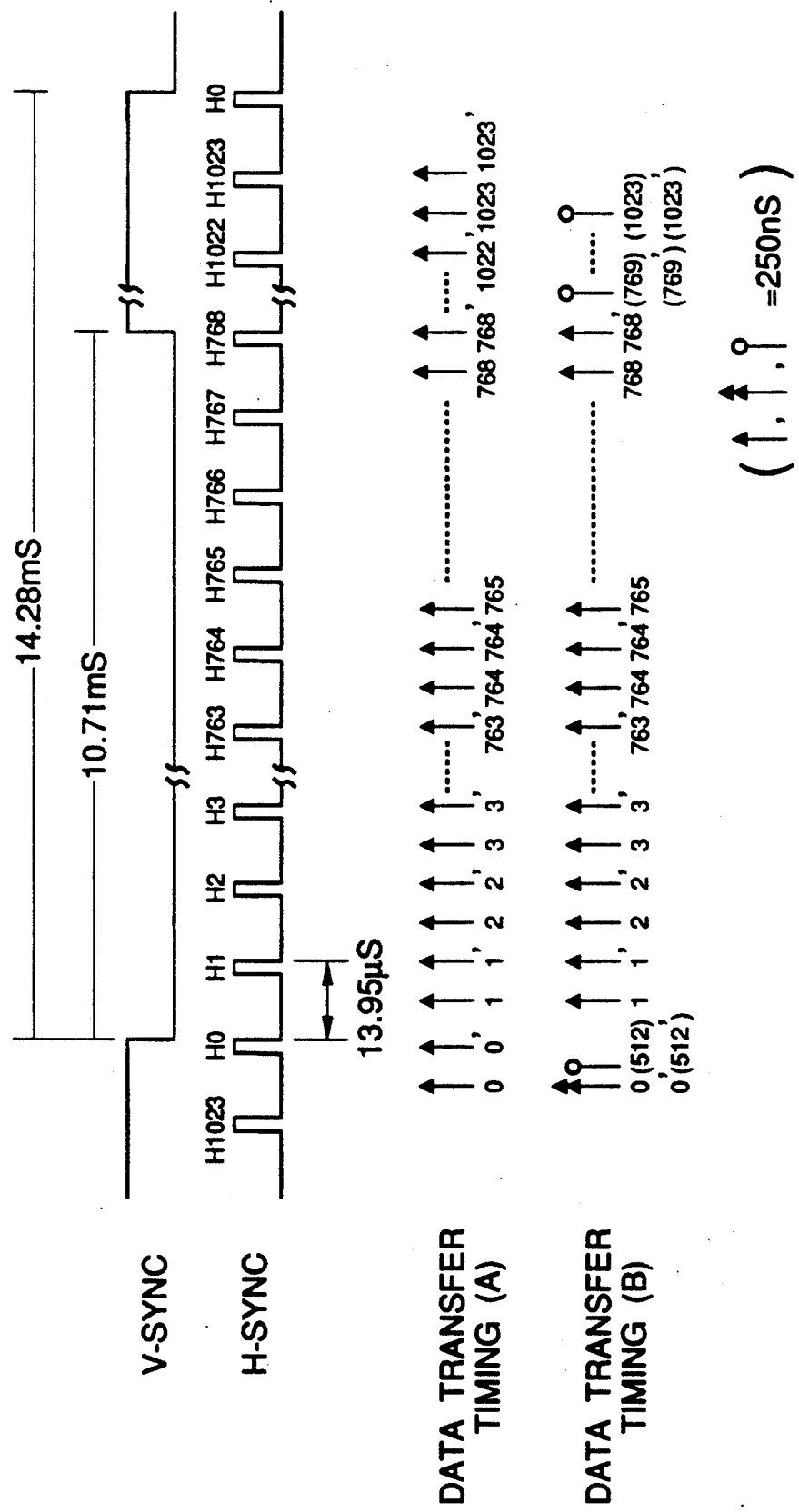
FIG. 4 is a timing chart illustrating the timing between a vertical synchronous signal and a horizontal synchronous signal in a display apparatus and the data transfer carried out in the semiconductor memory device shown in FIG. 1.

Referring to FIG. 4, there is shown a timing chart illustrating the timing between a vertical synchronous signal and a horizontal synchronous signal in a display apparatus and the data transfer carried out in the semiconductor memory device shown in FIG. 1. In FIG. 4, the data transfer timing (A) shows a timing in a memory of the type in which a data reading start position can be designated in the split data transfer, and the transfer timing (B) shows a timing in a memory of the type in which a data reading start position can be designated in a special data transfer. In addition, a single-head arrow indicates a split data transfer cycle, and a double-head arrow shows the special data transfer cycle. A circle-ended bar means a cycle used exclusively for only the refresh. The numbers given under the single-head arrows, the double-head arrow and the circle-ended bars shows the word line numbers.

As shown in FIG. 4, assume that the memory device has a capacity of 256K×4 bits, and is required or standardized to be refreshed at an interval not greater than 512 cycle/8 milliseconds, and the memory device is used with 250 nanoseconds/cycle. On the other hand, assume that the display has a display capacity of 1024 dots×768 dots, and has a vertical synchronous pulse interval of 14.28 milliseconds under the display period of 11.2 milliseconds, and horizontal synchronous pulse interval of 13.95 microseconds. Under this condition, a time required or consumed for the split data transfer within a period of one second (1000 milliseconds) is as follows, in both of the conventional memory device and the disclosed memory device;

(512 words)×(2 split transfer cycles/word)×(70 vertical synchronous pulses/second)×(250 nanoseconds/cycle) = 17.92 milliseconds Here, considering the time interval of the refresh operation performed by only the split data transfer, the memory cells are refreshed at an interval of about 14.3 milliseconds in the conventional memory device. Accordingly, it is not possible to refresh the memory cells by means of only the split data transfer. On the other hand, when the disclosed memory device is refreshed by only the split data transfer, the memory cells are refreshed at an interval of about 7.2 milliseconds, which is shorter than the standardized refreshing interval. Accordingly, it is possible to refresh the memory cells by means of only the split data transfer.

As seen from the above, the conventional memory device is required to be refreshed in addition to the refresh operation performed in the process of the split data transfer operation. In other words, it is necessary to prepare a cycle performed exclusively for only the refresh operation. A time required or consumed for the exclusive refresh cycle within a period of one second (1000 milliseconds) is as follows:

512 cycles×(8×10$^{-3}$)×250 nanoseconds = 16 milliseconds

Here, considering from the viewpoint of the system utilizing the display apparatus, the time required or consumed for the split data transfer and the refresh operation corresponds to a time in which the memory device cannot be accessed. Therefore, this inaccessible time gives a great influence to the processing capacity of the system. The disclosed memory device can reduce the inaccessible time to about 53%.

Figure 5:
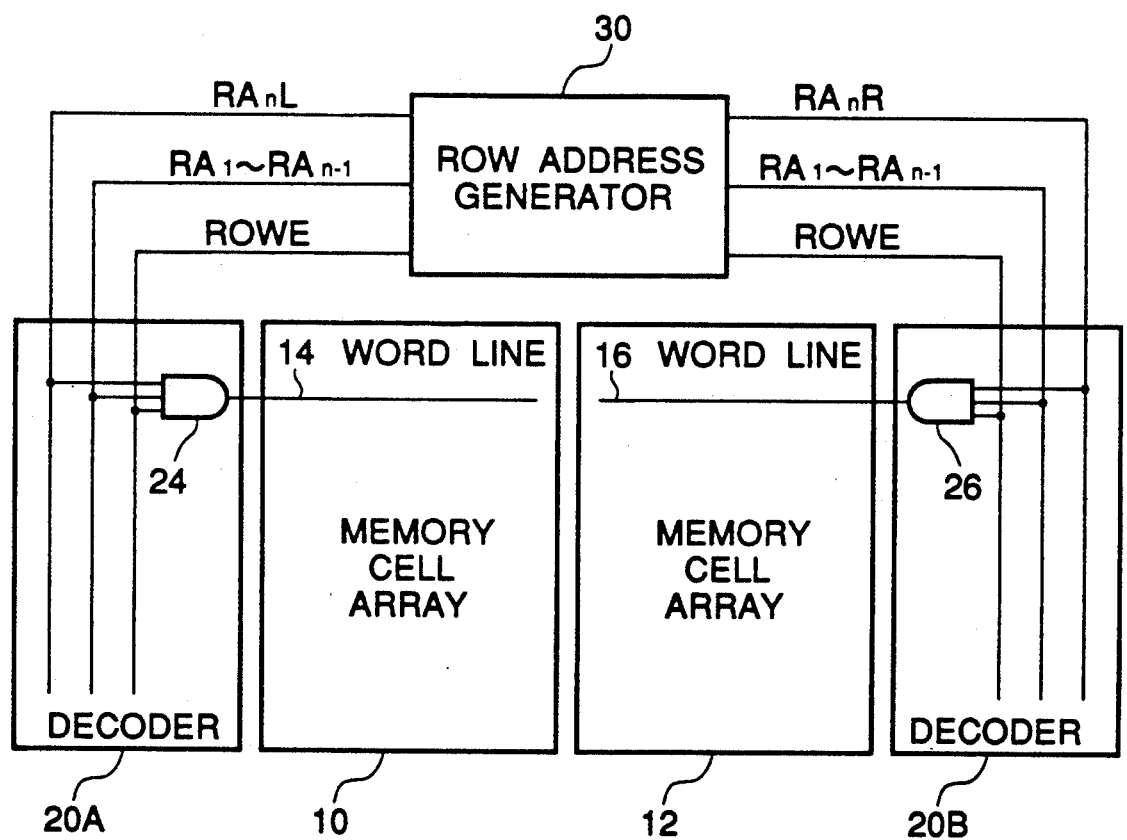
FIG. 5 is a block diagram of a memory cell array section of a second embodiment of the semiconductor memory device in accordance with the present invention.

Referring to FIG. 5, there is shown a block diagram of a memory cell array section of a second embodiment of the semiconductor memory device in accordance with the present invention. In FIG. 5, elements corresponding to those shown in FIG. 1 are given the same Reference Numerals, and explanation thereof will be omitted.

As seen from comparison between FIGS. 1 and 5, the second embodiment is characterized in that the decoder circuit is divided into decoder circuit 20A associated only the lower memory cell array 10 and a decoder circuit 20B associated only the upper memory cell array 12. Accordingly, the row address signals RA$_1$ to RA$_{n-1}$ and the control signal ROWE are divided into ones for the decoder circuit 20A and ones for the decoder circuit 20B. With this arrangement, the degree of freedom in the design of the memory cell arrays 10 and 12 is improved. Of course, the second embodiment has the same advantage as that obtained in the first embodiment.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory device comprising:

a random memory cell array including a number of memory cells arranged in the form of a matrix and having a plurality of word lines and a plurality of digit lines so that access can be permitted to a selected memory cell by selecting one word line in accordance with a row address and also selecting one digit line in accordance with a column address, said random memory cell array being divided into first and second memory areas in such a manner that each of said word lines is divided into first and second portions and said digit lines are divided into a first group of digit lines and a second group of digit lines;

a data register means coupled to said digit lines of said random memory cell array in parallel for temporarily holding data read out onto the respective digit lines from selected memory cells;

a row address generator receiving an input row address and for generating a first row address signal designating a first row corresponding to said input row address, and a second row address designating a second row different from said first row; and a controller means coupled to the first and second portions of each of said word lines, and responding to said first and second row address signals so as to cause to transfer to said data register means, data stored in the memory cells which are included in one row designated by said first row address signal and which belong to one of said first and second memory areas, and also so as to cause to refresh the memory cells which are included in one row designated by said second row address signal and which belong to the other of said first and second memory areas.

2. A semiconductor memory device claimed in claim 1 wherein said controller means includes a first address decoder coupled to all the word lines of said first memory areas and a second address decoder coupled to all the word lines of said second memory areas, and wherein said row address generator alternately supplies said first and second row address signals to said first and second address decoders or to said second and first address decoders, respectively.

3. A semiconductor memory device claimed in claim 1 wherein said random memory cell array includes $2^n$ word lines and $2^m$ digit lines, and each of said memory cells is located at a corresponding one of intersections between said $2^n$ word lines and said $2^m$ digit lines so that access can be permitted to a memory cell at one selected intersection by selecting one word line in accordance with a row address of "n" bits and also selecting one digit line in accordance with a column address of "m" bits.

4. A semiconductor memory device claimed in claim 1 wherein said row address generator includes latch means for latching external address signals and a split transfer mode signal, and a combination logic circuit means receiving the external address signals latched in said latch means so as to output the external address signals excluding the most significant external address signal, as they are, as common row address signals excluding the most significant row address signal, said combination logic circuit means also receiving a control signal indicative of which of said first and second memory areas should be read out, so that when said split transfer mode signal is active, said combination logic circuit means responds to an active control signal to output the most significant external address signal latched in said latch means, as the most significant row address signal for said first memory areas, and an inverted signal of the most significant external address signal latched in said latch means, as the most significant row address signal for said second memory areas, and responds to an inactive control signal to output the most significant external address signal latched in said latch means, as the most significant row address signal for said second memory areas, and the inverted signal of the most significant external address signal latched in said latch means, as the most significant row address signal for said first memory areas.

5. A semiconductor memory device claimed in claim 4 wherein said controller means includes a first address decoder coupled to all the word lines of said first memory areas and receiving said common row address signals and said most significant row address signal for said first memory areas, and a second address decoder coupled to all the word lines of said second memory areas and receiving said common row address signals and said most significant row address signal for said second memory areas.

* * * * *